United States Patent [19]

Frederickson

[11] Patent Number: 4,913,740

[45] Date of Patent: Apr. 3, 1990

[54] SOLUTION FOR USE IN THE PREVENTION OF SMEAR IN THE MANUFACTURE OF PRINTED CIRCUIT BOARDS

[76] Inventor: Jeffrey W. Frederickson, 2107 SW. Edgewood Rd., Portland, Oreg. 97201

[21] Appl. No.: 261,263

[22] Filed: Oct. 24, 1988

Related U.S. Application Data

[63] Continuation-in-part of Ser. No. 87,000, Aug. 18, 1987.

[51] Int. Cl.$^4$ ............................ C04B 9/02; B22F 7/00
[52] U.S. Cl. ................................ 106/1.11; 106/14.12; 106/14.13; 106/14.15
[58] Field of Search ............... 106/14.12, 14.13, 14.15, 106/1.11; 427/97

[56] References Cited

U.S. PATENT DOCUMENTS

| | | | |
|---|---|---|---|
| 4,294,729 | 10/1981 | Bakos | 252/170 |
| 4,342,607 | 8/1982 | Zado | 148/24 |
| 4,495,007 | 1/1985 | Zado | 148/24 |
| 4,557,767 | 12/1985 | Hwang | 148/24 |
| 4,749,449 | 6/1988 | Scott | 204/15 |
| 4,790,912 | 12/1988 | Holtzman | 427/305 |

*Primary Examiner*—Shrive Beck
*Assistant Examiner*—Vi D. Dang
*Attorney, Agent, or Firm*—Chernoff, Vilhauer, McClung & Stenzel

[57] ABSTRACT

A solution and a method of using it for preventing smear in the manufacture of printed circuit boards includes monoethanolamine combined with a fatty acid for neutralizing the active amine except in the presence of relatively high heat, and a surface tension reducing agent. The solution is applied to the printed circuit board as holes are being drilled. The friction of the drill bit on the printed circuit board generates heat which activates the amine allowing it to attack the inner glass epoxy walls of the printed circuit board and prevent smear.

4 Claims, No Drawings

SOLUTION FOR USE IN THE PREVENTION OF SMEAR IN THE MANUFACTURE OF PRINTED CIRCUIT BOARDS

This application is a continuation-in-part of my co-pending patent application serial No. 087,000 filed Aug. 18, 1987.

BACKGROUND OF THE INVENTION

The following invention relates to a solution and a method of using that solution for treating printed circuit boards to prevent smear in the manufacture thereof.

During the manufacture of printed circuit boards made of a fiberglass epoxy having top and bottom conducting copper layers sandwiching a glass epoxy layer, and including conductive layers within the sandwich, holes are drilled which are then electroless plated to create circuit paths from one copper layer to the other. When these holes are drilled, a phenomenon known as "smear" may result. Smear is a dielectric material which is deposited on the inner surfaces of the holes made by the drill. The smeared inner walls of the drilled-out holes resist electroless copper deposition and the smeared material may also effectively cover inner copper conductive layers in multi-layer boards creating a void or causing poor adhesion such that no electrical contact is made between the inner walls of the hole and the inner conductive layers.

Smear is an industry-wide problem in the manufacture of printed circuit boards, and many approaches have been suggested as solutions. The most common approach, called "desmear," is to attempt to remove the smear after the holes have been drilled. Smear removal generally takes the form of immersing the boards in a strong sulfuric acid bath to roughen or remove the smear and then subsequently rinsing the boards. This approach is expensive and leads to other problems such as residues left by the sulfuric acid which also interfere with the electroless deposit of copper in the printed circuit board holes. Other approaches use chemicals other than sulfuric acid; nevertheless in these processes, it is necessary to treat the board after the holes have been drilled and then to rinse the treatment chemical away. The rinsing step, in particular, may be extremely time consuming and the equipment needed for post drilling treatment of the boards for any type of smear removal process is very expensive.

The only other known attempts to control smear prior to drilling involve spraying ultracold liquid air or liquid nitrogen on the drill bit prior to drilling, or the immersion of the boards in a water bath during drilling. In both cases the theory is that if the temperature of the drill bit can be kept low enough, smear will not form. Neither of the above approaches are viable because the specific heat of the epoxy is such that it reaches a melting point quickly, even though the drill bit is cold.

SUMMARY OF THE INVENTION

The present invention is a solution, which prevents smear from forming as the holes are being drilled. According to the invention, the holes are drilled in the presence of the solution which contains at least one active amine which, when heated by the friction of the drill bit going through the board, causes the amine to attack and remove smear as it is being generated. The board is drilled as the solution is applied directly to the drill bit in the form of a spray or jet.

The solution used for treating the boards in this way comprises active amines which may include monoethanolamine, fatty acids which preferably include oleic acid, and an agent, which may be an alcohol, to reduce surface tension. An organo phosphate may also be added to provide stabilization and high pressure lubricity. A solution may be prepared comprising approximately 9% active amines, 10% fatty acids, and 0.1% alcohol with the balance of the solution being water and other ingredients such as lubricants depending upon the application. The alcohol reduces the surface tension of the solution so that it may easily penetrate the holes as they are being drilled. The oleic acid inhibits the corrosive effect of the monoethanolamine and keeps it from attacking the other portions of the board except in the presence of heat. Due to the high temperatures created by the friction of the drill bit going through the board, the monoethanolamine overcomes the inhibiting effect of the oleic acid and becomes very active, treating the inner walls of the hole as the drill bit goes through. Because the heat is generated locally in the area around the drill, on all other portions of the board the amine remains neutral, inhibited by the oleic acid. Since smear is prevented during the drilling operation, the necessity for expensive post drilling smear removal methods is obviated.

It is a primary object of this invention to provide a chemical solution and method for the prevention of smear in the drilling of printed circuit boards.

A further object of this invention is to provide a chemical solution which can be used to treat printed circuit boards during a drilling operation which will actively prevent smear in the region of the hole as it is being drilled without damaging the remainder of the board.

The foregoing and other objectives, features and advantages of the present invention will be more readily understood upon consideration of the following detailed description of the invention taken in conjunction with the accompanying drawings.

DETAILED DESCRIPTION OF THE INVENTION

A solution comprising 9% active amines, 10% fatty acids, a surface tension reducing agent and water is applied to a drill bit as a spray as the bit engages a multi-layer circuit board. Monoethanolamine is the preferred active amine, oleic acid may be used as one of the fatty acid components, and amyl alcohol works well as a surface tension reducing agent. High and low pressure lubricants and stabliizers may also be included.

The solution, although containing active amines, is neutralized by the fatty acids except in the presence of heat. Heat, however, is generated by the drill bit as it makes contact with the printed circuit board. When this occurs the monoethanolamine becomes very active and overcomes the neutralizing effect of the acid. Thus, in the region of the hole thus being formed, the monoethanolamine attacks the glass epoxy as the hole is being drilled and prevents smear from forming.

The preferred method of applying the solution is to spray it on the drill bit or in the vicinity of the hole to be drilled so that the solution coats the bit as it engages the board. It will occur to one of ordinary skill in the art that other methods could be employed for applying the solution to the areas being drilled simultaneously with the drilling operation. What is important, however, is that the solution be applied in such a manner that it enters the hole being formed by the drill. When this occurs the heat of the drill bit will activate the monoethanolamine which will allow it to prevent smear from forming. Another useful side effect of the solution is that it cleans the hole as it is drilled, removing burrs, particles and other matter that often remains in the hole after the drilling operation. The solution lowers the coefficient of friction at the interface of the drill to copper thus enabling the drill to pass through the boards with improved accuracy. This helps to obviate the need for a series of post drilling treatment steps.

The solution primarily comprises monoethanolamine, oleic acid, amyl alcohol and water. The oleic acid is a fatty acid which keeps the monoethanolamine neutral except in the presence of high heat, where it becomes very active. Other fatty acids, however, may have the same effect and it is not necessary that oleic acid be used exclusively. The amyl alcohol is an agent which reduces the surface tension of the solution thus permitting it to enter the relatively small holes formed by a drill bit. Other alcohols, however, will also perform this function. The monoethanolamine works best with printed circuit boards comprising layers of copper sandwiching glass epoxy layers. Other active amines, however, may work better with other printed circuit board materials. The proportions may also be varied to fit the particular circumstances of the drilling operation and other ingredients having special functions may be added. In particular, the amount of alcohol is dictated by the overall viscosity of the solution; the more viscous the solution, the more alcohol is needed. The relative proportions of the active amine and the fatty acid are dictated in part by the materials of the printed circuit board and also in part by the amount of heat generated by the drill bit.

An example of a preferred formula for the solution of the invention is shown below in Table 1.

TABLE 1

| Emery 880 | 5.0% V/V |
|---|---|
| Emery 621 | 5.0% V/V |
| Monoethanolamine | 8.0% V/V |
| GAF LP 700 | 2.0% V/V |
| Diethylamine | 1.0% V/V |
| Nitrilotriacetic acid (NTA) | 0.5% W/V |
| Primary amyl alcohol | .1% V/V |
| Deionized water | balance |

Some of the ingredients listed above are proprietary chemicals. The Emery 880 and Emery 621 are available from Emery Chemical Corporation of Cincinatti, Ohio. Emery 880, which functions like oleic acid, is a blend of with oleic acid, nonanoic acid and minor amounts of other higher fatty acids. Emery 621, which functions like the Emery 880 and in addition is a low pressure lubricant and surface tension reducer, is a natural product coconut fatty acid whose primary ingredient is lauric acid other ingredients are myristic acid, palmitic acid, oleic acid, decanoic acid, octanoic acid, stearic acid, and linoleic acid. GAF LP 700, which provides high pressure lubricity and helps to prevent delamination is a surfactant product of GAF Corporation of Wayne, N.J., and is essentially an organo phosphate comprising polyoxyethylene phenyl ether phosphate. The NTA provides hard water stability where the water has a high mineral content. This helps to prevent tarnish and is also an anti-foaming agent; EDTA may be used as a substitute for NTA.

When the solution described above is dispensed by spraying it on the drill bit during drilling, the shearing ability of the drill bit is increased due to the lubricity provided by the solution and this prevents the substrate material from adhering to the drill. The solution is able to penetrate the holes formed by the drill because of agents such as amyl alcohol and lauric acid which reduce surface tension. Another property of the solution is that it deposits an anti-tarnish layer which prevents oxidation and allows for quicker initiation of the electroless copper deposit which is used to plate the interior of the holes. In addition, the solution has a high specific heat that quickly cools the drill which also helps to prevent smear from forming. Another advantage of using the solution is the reduction of wear to both the primary cutting face and the margin cutting edge of the drill. This is caused by the lubricating effect of the solution and the resulting reduction in wear and increased efficiency of the cutting edges are clearly evidenced by the wear pattern on drills after thousands of strokes.

There are a number of benefits of this process to the user which are not possible with prior art desmearing lines or other processes. First, throughput and production are increased because larger stack heights for the same size tools are possible. A higher feed rate, a higher drilling speed and higher chip loads are also possible. Drills last longer and longer flute lengths are permitted by the lubricity of the liquid without losing the registration of the holes of the bottom panel. Also less carbide stock is removed during a repoint operation. This means that the drills may be repointed more times before minimal flute length is reached. Waste treatment of the solution is not difficult since the solution completely dissipates in water, and does not contain any heavy metals or strong oxidizing agents or acids.

Use of the solution provides certain other benefits to the printed circuit boards nd to the drill bits used on them. For example, there is less deformation of the inner layers of multilayered printed circuit boards. Also, delamination or "pink ring" is decreased, and the quality of the hole is better because of a decrease in the amount of loose fibers left in the hole.

A test using the solution of Table 1 was conducted to determine its effect upon printed circuit boards and the drill bit during drilling. In this study both hole quality and relative amounts of drill bit wear were compared between samples using the solution and control samples drilled completely "dry." The drilling was performed on multilayer FR4 circuit board material without an entry foil. Each drill was run for 1200 hits, although complete penetration of the circuit boards on the control samples was achieved in only 500 instances. The drilling parameters were as follows:

Drill Size: 0.016 inch diameter
Speed: 80,000 rpm
Feed Rate: 80 inches per minute
Chip Load: 0.0010 inches per REV The solution was dispensed so that it coated the drill bit during drilling for the test group. As mentioned previously, the control group was drilled "dry." A scanning electron-microscope was used to evaluate the relative amounts of drill bit wear. The drill bit runs with the solution showed markedly better "stay-sharp" ability especially considering that the drills in the control runs did not completely penetrate most of the holes.

The circuit board samples were initially plated with electroless copper immediately after drilling with no cleaning or etching. They then received a copper strike and electrolytic copper plating to preserve the holes in the as-drilled condition as much as possible. Sections representing the start, middle and end of the drill runs were then removed and prepared for metallographic examination.

The results of the hole quality study indicated that the circuit boards drilled dry showed generally rougher hole walls. The top sides of these boards showed an enlarged hole diameter indicating a greater degree of drill tip wandering and high compressive stress. There was a much greater degree of burring and deformation of the surface clad and inner layers. This would suggest that drilling dry imparts greater axial loads and frictional forces to the drill bit than when the solution is used. Intermittant evidence of smear was also detected in the dry samples.

The holes drilled with the solution appeared relatively smooth sided and seemed to have less disturbance in the vicinity of the glass fibers. Little or no burring was generated on either side of the board and no resin smear was detected in any hole that was examined. There was virtually no degradation of hole quality from the start to the end of the run 1200 hits later.

The solution enabled the drill bit to remain sharp significantly longer. After 1200 hits it was still producing good quality holes that were free of resin smear, burring and excessive deformation of the circuit board material.

While the test results described above were obtained using the solution of Table 1, other formulations for the solution may be preferable depending upon the precise type of circuit board material to be used. In particular, the following table, Table 2, shows the acceptable ranges for constituent components of the solution.

TABLE 2

| | |
|---|---|
| 2–10% V/V | Emery 880 or oleic acid |
| 2–10% V/V | Coconut fatty acid or Emery 621 |
| 4–15% V/V | Monoethanolamine |
| 1–7% V/V | GAF LP-700 or an organo phosphate |
| 0.5–4% V/V | Diethylamine |
| 0.1–1% W/V | NTA or EDTA |
| .1–.2% V/V | Amyl Alcohol |
| Balance is deionized water | |

The terms and expressions which have been employed in the foregoing abstract and specification are used therein as terms of description and not of limitation, and there is no intention in the use of such terms and expressions of excluding equivalents of the features shown and described or portions thereof, it being recognized that the scope of the invention is defined and limited by the claims which follow.

What is claimed is:

1. A composition for preventing smear in the drilling a printed circuit board having a fiberglass/epoxy substrate, said composition consisting essentially of the following components in the following amounts:
   (a) 4–20 vol% fatty acids;
   (b) 4–20 vol% of an amine selected from monoethanolamine, diethylamine, and mixtures thereof;
   (c) 1–7 vol% of a surfactant;
   (d) 0.1–0.2 vol% n-amyl alcohol; and
   (d) balance water.

2. The solution of claim 1 wherein the fatty acids are selected from the group consisting of lauric, oleic, decanoic and octanoic acids.

3. The composition of claim 1 wherein the surfactant is an organophosphate.

4. The composition of claim 1 including 0.1–1.0 wt% of a chelating agent selected from nitrilotriacetic acid and EDTA.

* * * * *

UNITED STATES PATENT AND TRADEMARK OFFICE
CERTIFICATE OF CORRECTION

PATENT NO. : 4,913,740

DATED : April 3, 1990

INVENTOR(S) : Jeffrey W. Frederickson

It is certified that error appears in the above-identified patent and that said Letters Patent is hereby corrected as shown below:

Column 2, line 51, change "stabliizers" to --stabilizers--.

Column 3, line 50, delete "with" at beginning of line.

Column 4, line 35, change "nd" to --and--;

Column 6, line 19, before "a printed" insert --of--;

Column 6, line 27, change "(d)" to --(e)--;

Column 6, line 32, change "organophosphate" to --organo phosphate--.

Signed and Sealed this

Eighth Day of December, 1992

*Attest:*

DOUGLAS B. COMER

*Attesting Officer*     Acting Commissioner of Patents and Trademarks